US008710851B2

United States Patent
Woo

(10) Patent No.: US 8,710,851 B2
(45) Date of Patent: Apr. 29, 2014

(54) METHOD OF MEASURING SPECIFIC ABSORPTION RATE OF ELECTROMAGNETIC WAVES

(75) Inventor: Jong-Myung Woo, Daejeon (KR)

(73) Assignee: The Industry & Academic Cooperation in Chungnam National University (IAC), Daejeon (KR)

( * ) Notice: Subject to any disclaimer, the term of this patent is extended or adjusted under 35 U.S.C. 154(b) by 376 days.

(21) Appl. No.: 13/142,304

(22) PCT Filed: Sep. 29, 2009

(86) PCT No.: PCT/KR2009/005567
§ 371 (c)(1),
(2), (4) Date: Jun. 27, 2011

(87) PCT Pub. No.: WO2010/076941
PCT Pub. Date: Jul. 8, 2010

(65) Prior Publication Data
US 2011/0267075 A1 Nov. 3, 2011

(30) Foreign Application Priority Data
Dec. 31, 2008 (KR) .................. 10-2008-0138179

(51) Int. Cl.
*G01R 27/04* (2006.01)
(52) U.S. Cl.
USPC .................................................. 324/629
(58) Field of Classification Search
None
See application file for complete search history.

(56) References Cited

U.S. PATENT DOCUMENTS 6,919,845 B2 * 7/2005 Ozaki et al. ............. 343/703
2011/0034135 A1 * 2/2011 Ali et al. .................. 455/103

FOREIGN PATENT DOCUMENTS

| EP | 1452880 | 9/2004 |
| KR | 20-0431585 | 11/2006 |
| KR | 10-0692920 | 3/2007 |
| WO | 2004-048949 | 6/2004 |

* cited by examiner

*Primary Examiner* — Paresh Patel
(74) *Attorney, Agent, or Firm* — Lexyoume IP Meister, PLLC

(57) ABSTRACT

Disclosed is an SAR measurement method that is capable of securing sufficient power within a short period of time and always maintaining the intensity of measurement signals irrespective of the measurement frequency. With the SAR measurement method, a plurality of measurement modules each with a control unit for processing location information and SAR measurement values, a memory unit for storing data, an antenna for making signal transception with the external, and a storage battery charged by way of inductive power are prepared. Thereafter, the plurality of measurement modules are arranged and installed within a phantom formed with a homogeneous material that conforms to the electrical characteristics of human body tissue. An electronic product to be measured in SAR is mounted at a predetermined location of the phantom with a predetermined posture. A high frequency of several hundred megahertz (MHz) to several hundred gigahertz (GHz) is scanned toward the phantom. The electronic product is operated with a predetermined pattern during a predetermined period of time. A measurement controller receives the data stored at the respective measurement modules to download and process the data, thereby verifying the SAR of the electronic product.

4 Claims, 2 Drawing Sheets

METHOD OF MEASURING SPECIFIC ABSORPTION RATE OF ELECTROMAGNETIC WAVES

TECHNICAL FIELD

The present invention relates to a method of measuring the specific absorption rate of electromagnetic waves (SAR), and more particularly, to an SAR measurement method for scanning a charging frequency and a measurement frequency in a separate manner so as to significantly enhance the intensity of measurement signals.

BACKGROUND ART

Recently, as the harmful effect of electromagnetic waves to the human body has been spotlighted, it has become a critical factor in the technology development of electric and electronic appliances to intercept or reduce the electromagnetic waves thereof. Particularly in the case of cellular phones of which there is nearly a one-to-one ratio with people, as they are used in contact with the human body (more specifically, the head), consumers rights organizations or national health agencies strictly regulate the radiation of electromagnetic waves thereof.

In order to evaluate the harmful effects of electromagnetic waves on the human body, relevant international or national agencies have presented standards of specific absorption rate (SAR) of electromagnetic waves, which is a measure of energy absorbed per unit mass in biological tissue when it is exposed to the electromagnetic waves.

It has been proposed as an SAR measurement technique that a phantom with built-in probes should be used to detect the intensity of electric fields absorbed therein from an electronic appliance such as a cellular phone.

With the conventional SAR measurement technique, the SAR is measured while continuously varying insertion positions of the probes to make surface distribution measurements, and the same process is again conducted to make minute volume distribution measurements. As such a process is repeated while varying the antenna state and the test position, it is very time consuming (for instance, three hours) to make a SAR for a single target product. Accordingly, the cellular phone manufacturers cannot make the SAR measurement with respect to all of the products, but are obliged to depend upon a sampling test. Furthermore, even in the case of the sampling test, sampling is difficult with respect to large numbers of products, thereby complicating the precise quality insurance.

Meanwhile, the phantom is not completed but is partially made such that only three sides thereof have outer skin while containing an imitation tissue gel therein. The probes are moved in the imitation tissue gel by a robot, and the SAR is measured while the one side of the phantom is in an opened state. Therefore, it is difficult to obtain a correct measurement value that can be approximated to reality so that the error range is enlarged. Furthermore, as the probes are repeatedly inserted into the imitation tissue and withdrawn therefrom, the imitation tissue gel is contaminated so it cannot be used for a long time. As a result, the high cost imitation tissue gel should be replaced, and such replacement is repeated frequently.

In order to solve the problem with the above-like probe usage technique, Korean Patent Publication No. 10-0600476 discloses a SAR measurement system and method capable of measuring the SAR within a short period of time by using an ultra-mini antenna and processors so as to obtain a precise measurement value that can be approximated to the practical SAR distribution.

However, with the SAR system and method disclosed in the Korean Patent Publication No. 10-0600476, whereas the whole SAR of the phantom can be measured in real time within a short period, it is difficult to precisely measure the SAR and to continuously make measurements with a predetermined temporal distance if the frequency is altered due to various usage environments of electronic products and the varied execution modes thereof.

Furthermore, Korean Patent No. 10-0692920 discloses a SAR system and method in which installs a memory unit is installed at a measurement module so as to continuously measure and store the SAR for a predetermined period of time, and to identify variations in the SAR by downloading and analyzing the stored data.

However, with the SAR system of the Patent No. 10-0692920, as the frequency signals received by the measurement module to make the measurement are used as driving power, it may be difficult to obtain desired driving power if the frequency signals to be measured are low in level. Accordingly, the measurement signals transmitted from the measurement module are weak, and a degree of amplification of several times should be conducted in order to receive and process the measurement signals. Furthermore, signal distortion may occur during the amplification process.

The above information disclosed in this Background section is only for enhancement of understanding of the background of the invention and therefore it may contain information that does not form the prior art that is already known in this country to a person of ordinary skill in the art.

DISCLOSURE OF INVENTION

Technical Problem

The present invention has been made in an effort to provide an SAR measurement method as an improvement of Korean Patent No. 10-0692920, having advantages of always maintaining the intensity of measurement signals to be high irrespective of the level of the measurement frequency, as sufficient power is secured within a short period of time by using a charging high frequency and is supplied in a stable manner by installing a storage battery within a measurement module.

Technical Solution

An exemplary embodiment of the present invention provides an SAR measurement method. With the SAR measurement method, a plurality of measurement modules each with a control unit for processing location information and SAR measurement values, a memory unit for storing data, an antenna for external signal transception, and a storage battery charged by way of inductive power are prepared. Thereafter, the plurality of measurement modules are arranged and installed within a phantom formed with a homogeneous material that conforms to electrical characteristics of human body tissue. An electronic product to be measured in SAR is mounted at a predetermined location of the phantom with a predetermined posture. A high frequency of several hundred megahertz (MHz) to several hundred gigahertz (GHz) is scanned toward the phantom. The electronic product is operated with a predetermined pattern for a predetermined period of time. A measurement controller receives the data stored at the respective measurement modules to download and process the data, thereby verifying the SAR of the electronic product.

Advantageous Effects

With the SAR measurement method, sufficient power is secured within a short period of time as the high frequency-based power is supplied so as to charge the storage battery. Even when the measurement is made by using signals with a low-level frequency, the signals can be stably and reliably measured with sufficient intensity.

BEST MODE FOR CARRYING OUT THE INVENTION

Figure 1:
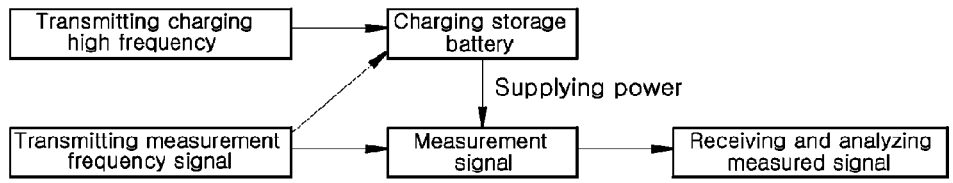
FIG. 1 is a schematic block diagram illustrating an SAR measurement method according to an exemplary embodiment of the present invention.

The present invention will be described more fully hereinafter with reference to the accompanying drawings, in which exemplary embodiments of the invention are shown.

As shown in FIG. 2 to FIG. 5, an SAR measurement system according to an exemplary embodiment of the present invention includes a phantom 2, a plurality of measurement modules 20, and a measurement controller 10.

The phantom 2 includes imitation tissue 4 formed with a homogeneous material that conforms to the electrical characteristics of the human body tissue, and an outer skin 3 formed with the anatomical profile of the human body such that the imitation tissue 4 is enclosed therein.

Figure 2:
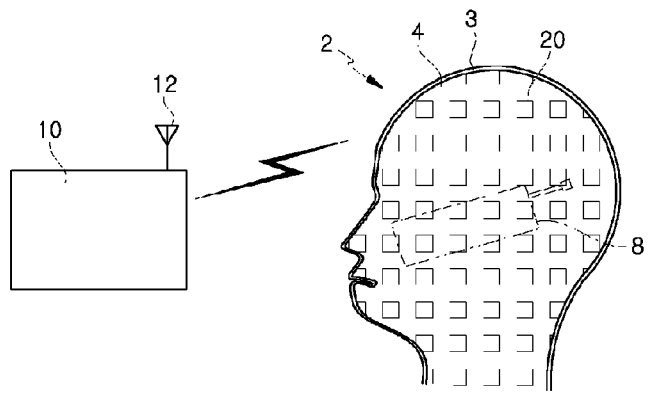
FIG. 2 is a schematic side view of an SAR measurement system used in an SAR measurement method according to an exemplary embodiment of the present invention.
Figure 3:
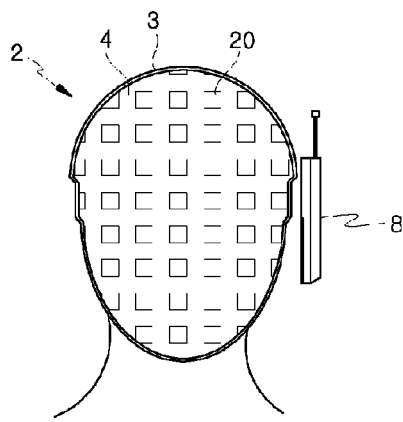
FIG. 3 is a front view illustrating the installation state of a phantom and an electronic product with an SAR measurement method according to an exemplary embodiment of the present invention.

The measurement modules 20 are arranged within the phantom 2 with a predetermined pattern. For example, the measurement modules 20 are arranged and installed at respective predetermined measurement locations as shown in FIG. 2 and FIG. 3 during the process of forming the imitation tissue 4.

The measurement module 20 includes a control unit 22 for processing information about the installation locations and SAR measurement values, a memory unit 26 for storing the data, an antenna 30 for external signal transception, and a storage battery 28 charged by way of inductive power.

The measurement controller 10 includes a measurement control unit 10 for transception with the measurement module 20 so as to download and process the data stored at the memory unit 26 of the measurement module 20.

The measurement module 20 is formed by attaching a processor 23 of the control unit 22, the antenna 30, the memory unit 26, and the storage battery 28 to a substrate 21 formed in the shape of a rectangle, a circle, or an oval with a length or a maximum diameter of several millimeters, by using a surface mounting technique.

It is also possible to directly form the processor 23, the antenna 30, and the storage battery 28 on the substrate 21 by way of printing or photolithography.

Unique numbers for the installation locations are determined at the measurement module 20, and are stored at the memory unit 26.

As the measurement module 20 may be processed with the unit of micrometers (rim) based on relevant technology development, it is possible to mount it on the substrate 21 with a size of several millimeters, and also to form it in the shape of a chip.

The memory unit 26 may be formed by using a flash memory such that the stored measurement data is not damaged.

Figure 5:
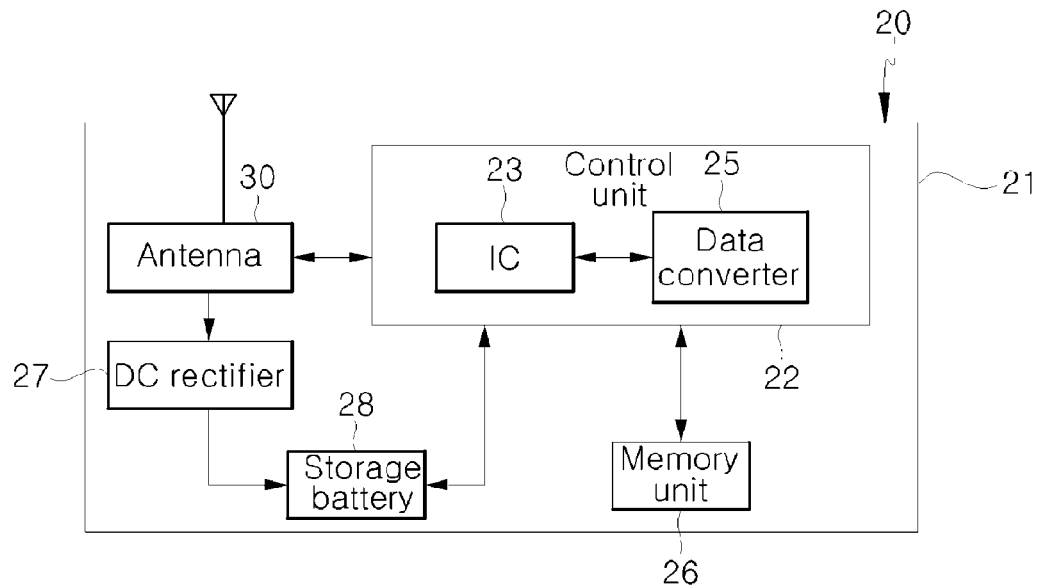
FIG. 5 is a schematic block diagram of a measurement module used in an SAR measurement method according to an exemplary embodiment of the present invention.

As shown in FIG. 5, the measurement module 20 includes a DC rectifier 27 for generating inductive power by partially using the frequency signals (the electromagnetic waves) received through the antenna 30 and rectifying the inductive power so as to charge the storage battery 28 therewith.

When the DC rectifier 27 is installed as above, it becomes possible to use the inductive power as the driving power by using the signals received from the antenna 30 without installing any separate power sources for driving the measurement modules 20. And even when a very large number of measurement modules 20 are installed within the phantom 2, the resulting structure is simplified with easy processing as wires for supplying power are not needed.

Figure 4:
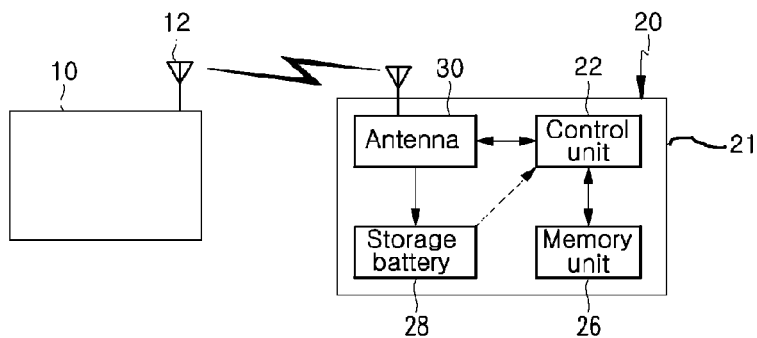
FIG. 4 is a schematic block diagram of an SAR measurement system used in an SAR measurement method according to an exemplary embodiment of the present invention.

As shown in FIG. 4 and FIG. 5, the control unit 22 includes a data converter 25 for converting the measurement signals and the signals processed at the processor 23 into digital signals.

The processor 23 is preferably installed with an amplification circuit such that the minutely-dimensioned frequency signals can be amplified so as to obtain precise measurement values.

The processor 23 samples the peak values from the values received at the antenna so as to continuously store them at the memory unit 26, and transmits the data stored at the memory unit 26 in combination with the unique number thereof when predetermined signals are received from the measurement controller 10, through the antenna 30 together with triggering signals. That is, the processor 23 samples the peak values from the values for the amplitude or the like of the frequency signals received through the antenna 30, and converts them into digital signals so as to continuously store them at the memory unit 26 and transmit them through the antenna 30.

As shown in FIG. 5, a storage battery 28 may be further installed at the measurement module 20 so as to apply power for driving the control unit 22.

The storage battery 28 is preferably formed as a rechargeable secondary battery, which makes it possible to continuously use the measurement module 20 without separating it from the phantom 2.

The storage battery 28 is structured such that the signals received through the antenna 30 are partially rectified by using the DC rectifier 27, and the desired charging then occurs.

An ultra-mini antenna may be used to form the antenna 30 such that it can be mounted on the substrate 21 with a size of several millimeters.

The antenna 30 is formed with a mini antenna of a size of millimeters (mm), or an ultra-mini antenna of a size of micrometers (m).

If the antenna 30 is enlarged in size, the measurement module 20 increases in dimension so that it becomes impossible to make the measurement with a minute distance. Furthermore, if the antenna 30 has a large size, the impedance is varied due to reciprocal coupling between the neighboring antennas, and errors are highly liable to occur for the measurement values due to the impedance variation. Therefore, the size of the antenna 30 is preferably ultra-minimized in order to obtain correct measurement values.

As shown in FIG. 2, the measurement controller 10 is provided with a transceiver antenna 12 to allow signal transception with the antenna 30 of the measurement module 20.

A receiver (not shown) is installed at the measurement controller 10 to receive the signals transmitted from the antenna 30. The measurement controller 10 converts the received signals so as to display them on a display device such as a monitor, while storing the SAR measurement values together with information about the locations of the measurement modules 20.

The measurement controller 10 is structured such that the charging high frequency ranging from several hundred megahertz (MHz) to several hundred gigahertz (GHz) is transmitted toward the phantom 2 through the transceiver antenna 12.

An SAR measurement method according to an exemplary embodiment of the present invention, which verifies the SAR of the target electronic product by using the above-structured SAR measurement system, will now be described.

First, as shown in FIG. 1 and FIG. 5, a plurality of measurement modules 20 each with a size of several millimeters or less are prepared such that they include a control unit 22, a memory unit 26, an antenna 30, and a storage battery 28, respectively.

A phantom 2 is made such that the measurement modules 20 are mounted at predetermined locations of the imitation tissue 4 formed with a homogeneous material that conforms to the electrical characteristics of the human body tissue.

When the making of the phantom 2 is completed, the measurement controller 10 is operated to transmit the charging high frequency ranging from several hundred megahertz (MHz) to several hundred gigahertz (GHz) toward the phantom 2 through the transceiver antenna 12.

When the charging high frequency is transmitted through the transceiver antenna 12, signals are received through the antenna 30 of the respective measurement modules 20 installed in the phantom 2, and the inductive power generated through the DC rectifier 27 is charged at the storage battery 28.

When the charging high frequency (for instance, the frequency signals ranging from several hundred megahertz (MHz) to several hundred gigahertz (GHz)) is transmitted through the transceiver antenna 12, the antenna 30 of the measurement module 20 installed in the phantom 2 receives the charging high frequency signals (the electromagnetic waves), and the DC rectifier 27 converts the received frequency signals (the received electromagnetic waves) into inductive power so as to charge the storage battery 28 therewith.

When the power is obtained from the charging high frequency without installing any separate power sources for driving the control unit 22, the resulting structure is simplified with easy processing as wires for supplying the power are not needed even when a large-sized phantom 2 is made, or when a very large number of measurement modules 20 are installed at the phantom 2.

It is also possible to transmit the charging high frequency toward the phantom 2 by installing a separate charging antenna (not shown) without using the transceiver antenna 12 of the charging controller 10.

When the storage battery 28 is charged through a process like the above, it becomes possible to drive the control unit 22 and transmit the measurement signals through the antenna 30 with sufficient intensity.

When the storage battery 28 is charged, an electronic product 8 such as a cellular phone is installed at a predetermined location of the phantom 2 and operated.

When the electronic product 8 is operated, predetermined electromagnetic waves are generated and transmitted in all directions, and the antenna 30 of the measurement module 20 installed in the phantom 2 receives the transmitted electromagnetic waves of the electronic product 8. At this time, the processor 23 is driven by way of the power supplied from the storage battery 28.

The processor 23 of the control unit 22 continuously or periodically samples the SAR from the amplitude or the like of the frequency received through the antenna 30, and stores it at the memory unit 26.

In a state as above, the electronic product 8 is operated with a predetermined pattern for a predetermined period of time, and the measurement controller 10 transmits the data receiving signals by using the transceiver antenna 12. The control units 22 of the respective measurement modules 20 transmit the data stored at the memory unit 26 together with the unique numbers thereof in accordance with the signals received through the antenna 30. The measurement controller 10 receives the data transmitted from the respective measurement modules 20 so as to download and process them, thereby verifying the SAR of the target electronic product 8.

Even when the frequency signals of the electronic product 8 are received through the antenna 30, some of the signals are converted into inductive power by way of the DC rectifier 27, and charged to the storage battery 28. That is, when the frequency signals are received by the antenna 30, it is also possible to always process the rectifying operation through the DC rectifier 27 and the charging operation at the storage battery 28, irrespective of which frequency signals (i.e., the charging high frequency or the frequency signals of the electronic product 8) are received by the antenna 30.

Although it is described above that the measurement is made through first transmitting the charging high frequency to charge the storage battery 28 and then operating the electronic product 8, it is also possible that the transmission of the charging high frequency and the operation of the electronic product 8 are conducted so as to process the charging of the storage battery 28 and the signal measurement occur in a simultaneous manner.

If there is a large difference in frequency band between the charging high frequency and the frequency signals of the electronic product 8, the charging high frequency may be filtered by installing a band filter (not shown) at the control unit 22 such that it is not included in the measurement signals.

If there is only a slight difference in frequency band between the charging high frequency and the frequency signals of the electronic product 8, even the measurement signals are liable to be partially filtered with the usage of the band filter. For this reason, it is preferable that the storage battery 28 is first charged without using the band filter, and the measurement is made thereafter.

Figure 6:
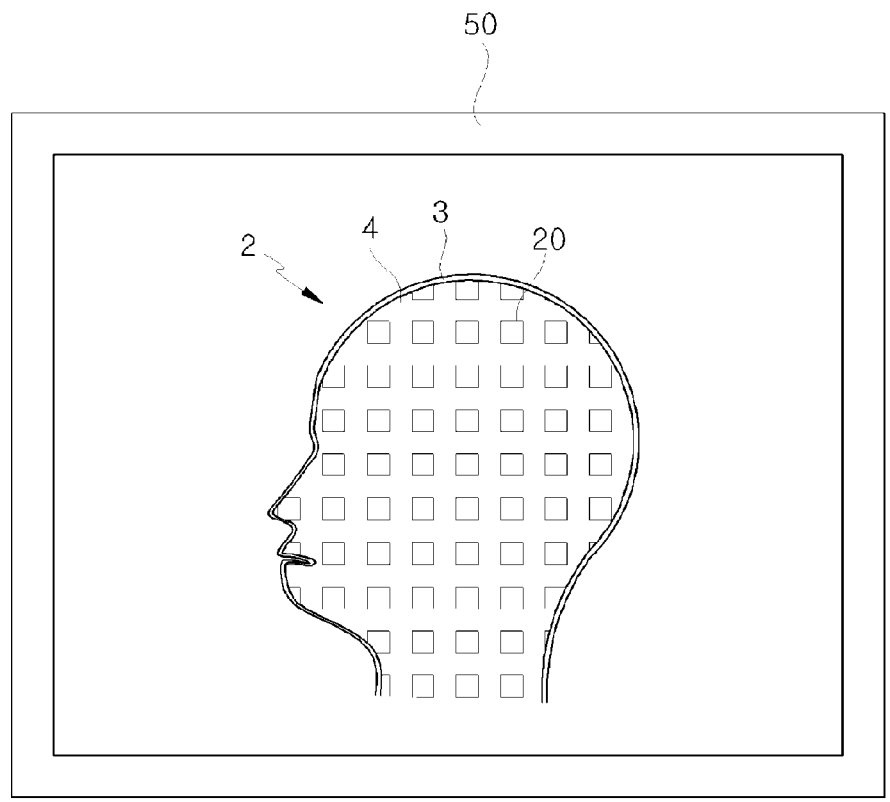
FIG. 6 is a schematic side view illustrating the charging state of a measurement module with an SAR measurement method according to another exemplary embodiment of the present invention.

With an SAR measurement method according to another exemplary embodiment of the present invention, as shown in FIG. 6, a phantom 2 is made by mounting a plurality of measurement modules 20 at the predetermined locations of the imitation tissue 4, and the phantom 2 is inserted within a microwave scanner 50 to scan microwaves (measurement high frequency) thereto. In this way, the measurement modules 20 mounted in the phantom 2 are charged, and the charged phantom picks up from the microwave scanner 20. Then, the target electronic product 8 is installed, and the measurement with respect thereto occurs.

The microwave scanner 50 may be formed with a common microwave dryer or a common electronic oven, and hence a detailed description thereof will be omitted.

If the phantom 2 is formed only with a head shape, the charging may occur by using a microwave scanner 50 like a small electronic oven so that the charging is very easy within a short period of time.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. An SAR measurement method comprising:
preparing a plurality of measurement modules each with a control unit for processing location information and SAR measurement values, a memory unit for storing data, an antenna for external signal transception, and a storage battery that is charged by way of inductive power;
arranging and installing the plurality of measurement modules within a phantom formed with a homogeneous material that conforms to the electrical characteristics of human body tissue;
mounting an electronic product to be measured in SAR at a predetermined location of the phantom with a predetermined posture;
scanning a high frequency of several hundred megahertz (MHz) to several hundred gigahertz (GHz) toward the phantom; and
operating the electronic product with a predetermined pattern during a predetermined period of time and receiving the data stored at the respective measurement modules by using a measurement controller to download and process the data, thereby verifying the SAR of the electronic product.

2. SAR measurement method of claim 1, wherein the step of scanning the high frequency so as to charge the storage battery and the step of operating the electronic product with a predetermined pattern are conducted in a simultaneous manner.

3. The SAR measurement method of claim 1, wherein the step of scanning the high frequency so as to charge the storage battery is first conducted, and the step of operating the electronic product with a predetermined pattern is conducted thereafter.

4. The SAR measurement method of claim 1, wherein the step of charging the storage battery is conducted by mounting a phantom within a microwave scanner for scanning microwaves (charging high frequency).

* * * * *